US012639505B1

(12) United States Patent
Raja

(10) Patent No.: US 12,639,505 B1
(45) Date of Patent: May 26, 2026

(54) CIRCUIT SIMULATION WITH OPTIMIZATION OF TRANSISTOR PROPERTY

(71) Applicant: Cadence Design Systems, Inc., San Jose, CA (US)

(72) Inventor: Shiva Raja, Chelmsford, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 812 days.

(21) Appl. No.: 17/990,609

(22) Filed: Nov. 18, 2022

(51) Int. Cl.
*G06F 30/398* (2020.01)

(52) U.S. Cl.
CPC .................................. *G06F 30/398* (2020.01)

(58) Field of Classification Search
CPC ................. G03F 9/7076; G03F 9/7084; H01L 23/49838; H01L 2924/1431; H01L 2924/1433; H01L 21/761; H01L 2224/13025; H01L 2224/0557; H01L 2224/05009; H01L 2224/08145; H01L 2225/06544; H01L 2924/13062; H01L 2924/1305; H01L 2924/12032; H01L 2924/13091; H01L 2924/0002; G06F 30/392; H10D 84/85; H10D 30/0411; H10D 30/0413; H10D 30/024; H10D 84/0165; H10D 86/215; H10D 84/834

USPC .................................................. 716/108–115
See application file for complete search history.

(56) References Cited

U.S. PATENT DOCUMENTS

| | | | | | |
|---|---|---|---|---|---|
| 2015/0311142 A1* | 10/2015 | Sekar | .................... | H01L 23/481 | |
| | | | | 257/499 | |
| 2019/0288112 A1* | 9/2019 | Wang | ...................... | H10D 30/65 | |
| 2019/0355826 A1* | 11/2019 | Avci | .................... | H10D 30/6211 | |

* cited by examiner

*Primary Examiner* — Binh C Tat
(74) *Attorney, Agent, or Firm* — Foley & Lardner LLP

(57) ABSTRACT

A technical solution can identify, in a circuit structure having a plurality of transistors and based on a predetermined body structure, at least one transistor among the plurality of transistors having a predetermined body structure, can identify a region that includes the identified transistor and that indicates a type of connection in the circuit structure between the identified transistor and one or more of the plurality of transistors, and can select, from among the at least one identified transistor and within the identified region, at least one selected transistor having a doping property that corresponds to a predetermined doping property, and can modify a voltage property of the at least one selected transistor to have a predetermined voltage property corresponding to a body voltage of the at least one selected transistor.

20 Claims, 11 Drawing Sheets

FIG. 3

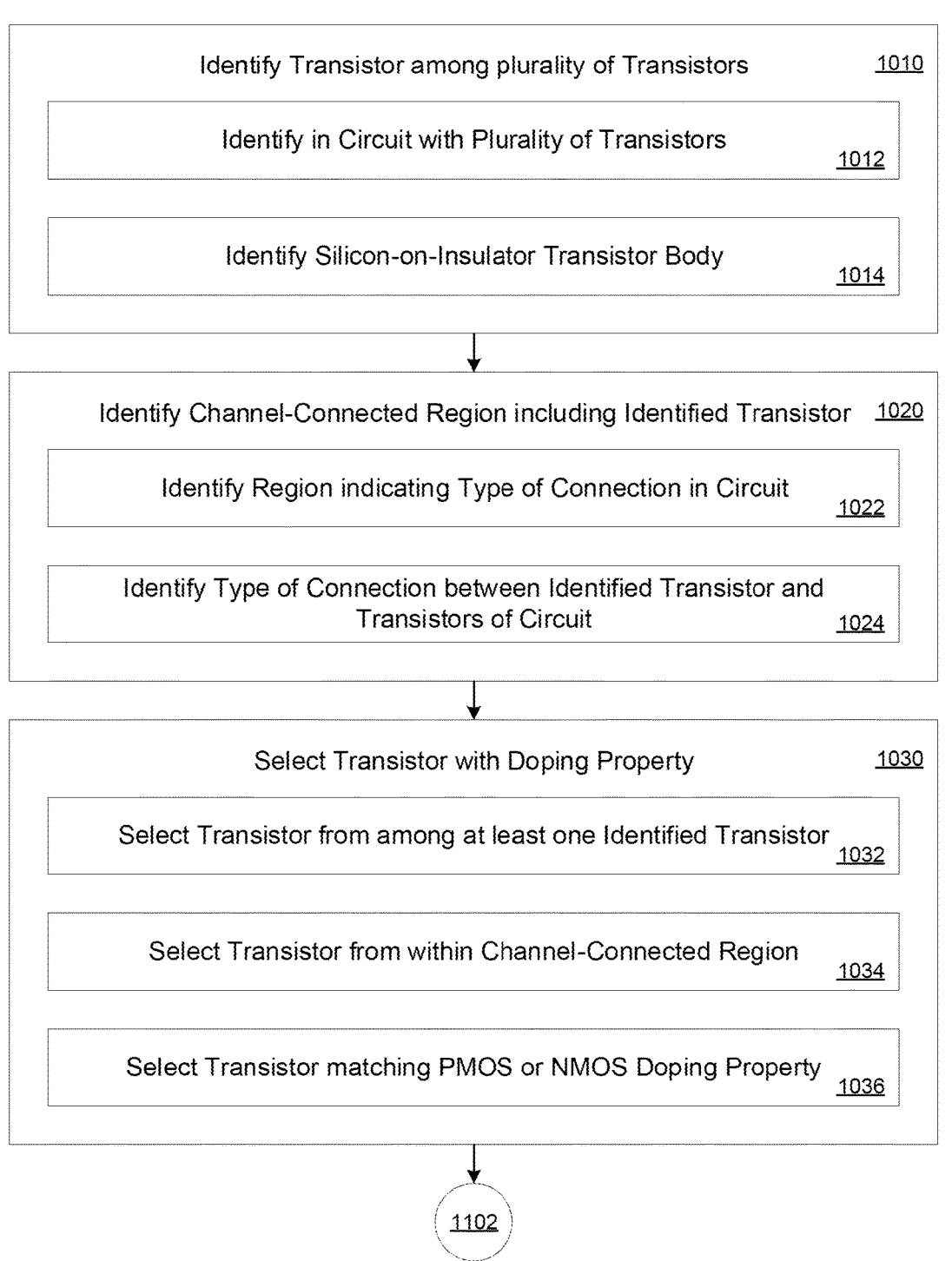

1000

Identify Transistor among plurality of Transistors          1010

Identify in Circuit with Plurality of Transistors          1012

Identify Silicon-on-Insulator Transistor Body          1014

Identify Channel-Connected Region including Identified Transistor          1020

Identify Region indicating Type of Connection in Circuit          1022

Identify Type of Connection between Identified Transistor and Transistors of Circuit          1024

Select Transistor with Doping Property          1030

Select Transistor from among at least one Identified Transistor          1032

Select Transistor from within Channel-Connected Region          1034

Select Transistor matching PMOS or NMOS Doping Property          1036

CIRCUIT SIMULATION WITH OPTIMIZATION OF TRANSISTOR PROPERTY

TECHNICAL FIELD

The present implementations relate generally to hardware simulation, and more particularly to a circuit simulation with optimization of a transistor property.

BACKGROUND

Computing hardware is increasingly complex and contributes to increasing demand for testing and simulation of computing hardware. As computing hardware increases in complexity, cost and time required to develop and test prototype hardware increases rapidly, causing significant delay and wasted resources. Conventional systems cannot effectively and efficiently test and validate computing hardware with sufficient speed and granularity to ensure correct and predictable operation of complex computing hardware.

SUMMARY

Aspects of this technical solution are directed to simulation of complex circuit architectures with increased speed and accuracy. Present implementations can include simulation of circuit architectures including particular transistor types, by identifying transistors having particular types and by identifying the configuration of various transistors or groups of transistors in the circuit architectures. Present implementations can modify one or more transistors based on the type of the transistor and the configuration of the transistor in the circuit architecture to achieve technical improvements including at least an increase speed of execution and an accuracy of simulation, by optimizing a circuit simulation of the simulation model to physical properties and performance characteristics of particular transistors in the circuit. Thus, a technological solution for a circuit simulation with optimization of a transistor property is provided.

In one embodiment, a system can optimize a transistor property in a circuit simulation and can include a data processing system. The data processing system can include memory and one or more processors. The data processing system can identify, in a circuit structure having a plurality of transistors and based on a predetermined body structure, at least one identified transistor among the plurality of transistors having the predetermined body structure. The data processing system can identify a region that includes the identified transistor and that indicates a type of connection in the circuit structure between the identified transistor and one or more of the plurality of transistors. The data processing system can select, from among the at least one identified transistor and within the region, at least one selected transistor having a doping property that corresponds to a predetermined doping property. The data processing system can modify a voltage property of the at least one selected transistor to have a predetermined voltage property corresponding to a body voltage of the at least one selected transistor and bounded by a maximum body voltage and a minimum body voltage.

In another embodiment, a method for optimizing a transistor property in a circuit simulation can include identifying, in a circuit structure having a plurality of transistors and based on a predetermined body structure, at least one identified transistor among the plurality of transistors having the predetermined body structure, the identified transistor corresponding to a type of connection in the circuit structure between the identified transistor and one or more of the plurality of transistors. The method can include selecting, from among the at least one identified transistor, at least one selected transistor having a doping property that corresponds to a predetermined doping property. The method can include modifying a voltage property of the at least one selected transistor to have a predetermined voltage property corresponding to a body voltage of the at least one selected transistor and bounded by a maximum body voltage and a minimum body voltage.

In yet another embodiment, a system to optimize a transistor property in a circuit simulation can include a data processing system. The data processing system can include memory and one or more processors. The data processing system can identify, in a circuit structure having a plurality of transistors and based on a silicon-on-insulator (SOI) transistor structure, at least one identified transistor among the plurality of transistors having the SOI transistor structure. The data processing system can identify a region that includes the identified transistor and that indicates one or more of a stack connection, a pull-up connection, and a pull-down connection in the circuit structure between the identified transistor and one or more of the plurality of transistors. The data processing system can select, from among the at least one identified transistor and within the region, at least one selected transistor having a doping property that corresponds to a predetermined doping property. The data processing system can modify a voltage property of the at least one selected transistor to have a predetermined voltage property corresponding to a body voltage of the at least one selected transistor and bounded by a maximum body voltage and a minimum body voltage.

BRIEF DESCRIPTION OF THE DRAWINGS

These and other aspects and features of the present implementations will become apparent to those ordinarily skilled in the art upon review of the following description of specific implementations in conjunction with the accompanying figures, wherein:

FIG. 3 illustrates a delay performance of simulation of a transistor, in accordance with some embodiments.

FIG. 8 illustrates a circuit including transistors associated with various channel-connected regions of a circuit, in accordance with some embodiments.

FIG. 10 illustrates a method for optimizing a transistor property in a circuit simulation, in accordance with some embodiments.

DETAILED DESCRIPTION

Figure 1B:
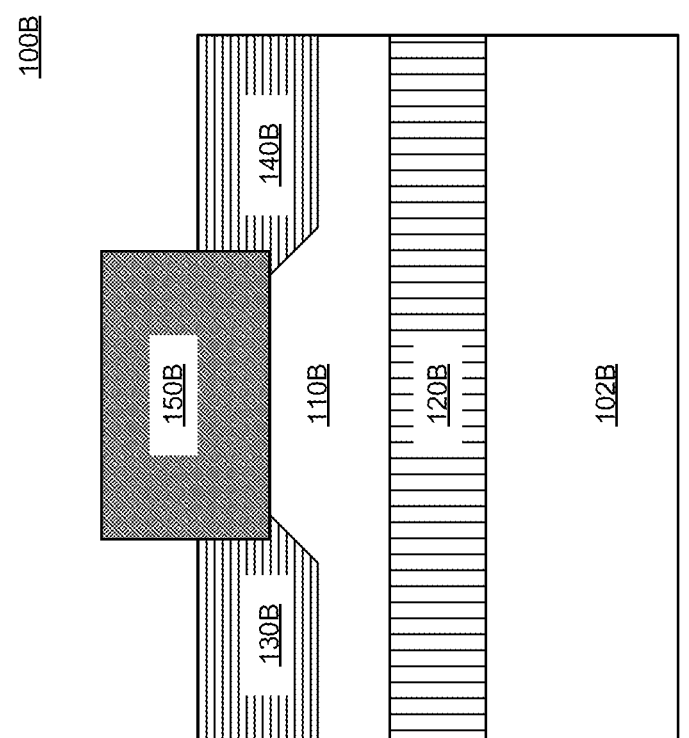
FIG. 1B illustrates a fully-depleted silicon-on-insulator transistor structure, in accordance with some embodiments.

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation, but other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto, but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

Simulation systems can execute simulations that correspond to operation of electrical and electronic circuits. These simulation systems can include various electrical and electronic devices in simulated or physical forms and can apply or modify one or more characteristics associated with the electrical or electronic devices. Electrical or electronic devices can include, for example, transistors, logic gates, micro-electromechanical sensors (MEMS), antennae, resistors, capacitors, inductors, or the like. A circuit can include a connection or combination of connections between any electrical or electronic devices. Characteristics of these electrical or electronic devices can include, for example, biasing voltages, body voltages, current tolerances, doping characteristics, and the like. A circuit simulation can include, for example, multiple blocks corresponding to electrical or electronic devices and connections between those blocks. The circuit simulation can provide library characterization of various blocks based on various conditions or constraints of those blocks. For example, the circuit simulation can support characterization of maximum and minimum voltages of a given block or of a particular portion or region of a given block. Thus, a circuit simulation in accordance with present implementations can provide at least the technical improvement of circuit simulation with increased accuracy based on a library characterization with high granularity within blocks of the simulated circuit.

Timing of partially-depleted (PD) silicon-on-insulator (SOI) transistor-based cells can be dependent upon the history of switching each PD SOI transistor individually. Switching of transistors can cause a dynamic shift in, for example, floating body voltage of the PD SOI. For Static-Timing Analysis (STA), a simulation can accurately be performed by limiting simulation to the bounds of the timing for the cell. Without history, simulation can result in lower floating body voltage (FBV) in particular transistors, resulting in a maximum timing for the cell including the PD SOI transistors. To characterize the minimum bounds of cell timing, present implementations include the history effect to execute simulation of a circuit with a pulsed input waveform or second switching which can capture the high FBV results in the minimum bound of timing on an individualized transistor basis.

Simulation systems can perform at maximum accuracy with characteristics that correspond at high granularity to characteristics of physical devices performing an equivalent operation. However, an increase in granularity can result in a decrease of speed of simulation. Thus, present implementations can provide a technical improvement of increasing the accuracy of a simulation including particular types of transistor devices under simulation, while reducing or minimizing reduction in speed of execution of a simulation, to achieve both high accuracy and high speed of simulation at least of simulation of circuits including particular types of transistors.

Figure 1A:
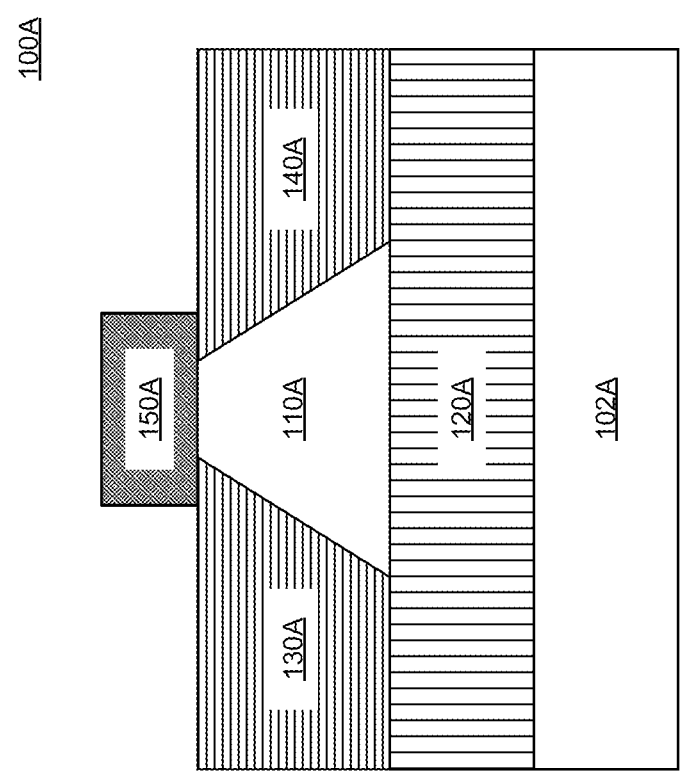
FIG. 1A illustrates a partially-depleted silicon-on-insulator transistor structure, in accordance with some embodiments.

FIG. 1A illustrates a PD SOI transistor structure in accordance with present implementations. As illustrated by way of example in FIG. 1A, an example transistor 100A can include a base substrate layer 102A, a floating body layer 110A, a buried oxide layer 120A, a source layer 130A, a drain layer 140A, and a gate layer 150A. The transistor 100A can correspond to a PD SOI transistor. An SOI transistor has advantages over a bulk transistor lacking a buried oxide layer, including improved performance and leakage characteristics. The transistor 100A can have a doping property that affects the operation of the transistor in response to particular electrical stimulus. For example, the doping property can correspond to an NMOS doping characteristic, and the second doping property corresponding to a PMOS doping characteristic. For example, the doping property can correspond to an NMOS doping characteristic or a PMOS doping characteristic. The base substrate layer 102A can include a silicon material or semiconductor material, for example.

The floating body layer 110A can include the silicon material and can be formed with the base substrate layer 102A as a single layer. The floating body layer 110A can have a particular voltage property corresponding to a biasing voltage, for example. For example, the voltage property can correspond to a first threshold voltage at a rising edge of a switching action of the at least one selected transistor, and the second voltage property can correspond to a second threshold voltage at a falling edge of the switching action of the at least one selected transistor. The floating body layer 110A can have a predetermined body structure corresponding to a PD SOI transistor structure. The floating body layer 110A can have a particular thickness in a vertical direction between the gate layer 150A and the buried oxide layer 120A that results in operation of the transistor in accordance with a PD SOI transistor. For example, a thickness of the floating body layer 110A in accordance with a PD SOI transistor can be between 50 nm and 90 nm.

The buried oxide layer 120A can include an oxidized silicon material or oxidized semiconductor material, for example. The buried oxide layer 120A can be formed within a silicon substrate in a region between the buried oxide layer 120A and the buried oxide layer 120A, by a semiconductor oxidation process during fabrication. The buried oxide layer 120A can be defined within a silicon substrate of a simulation circuit in a region between the buried oxide layer 120A and the buried oxide layer 120A, by one or more characteristics different from characteristics of one or more of the buried oxide layer 120A and the buried oxide layer 120A.

The source layer 130A can include a semiconductor material or have one or more characteristics corresponding to a source terminal of a transistor device. The source layer 130A can have a lower boundary adjacent to or in contact with the buried oxide layer 120A. The drain layer 140A can include a semiconductor material or have one or more characteristics corresponding to a drain terminal of a transistor device. The drain layer 140A can have a lower boundary adjacent to or in contact with the buried oxide layer 120A. The gate layer 150A can include a semiconductor material or have one or more characteristics corresponding to a gate terminal of a transistor device.

FIG. 1B illustrates a fully-depleted (FD) SOI transistor structure in accordance with present implementations. As illustrated by way of example in FIG. 1B, an example transistor 100B can include a base substrate layer 102B, a floating body layer 110B, a buried oxide layer 120B, a source layer 130B, a drain layer 140B, and a gate layer 150B. The transistor 100B can correspond to a FD SOI transistor. The base substrate layer 102B can correspond at least partially in one or more of structure and operation to the base substrate 102A. The base substrate layer 102B can have a thickness greater than a thickness of the base substrate 102A.

The floating body layer 110B can correspond at least partially in one or more of structure and operation to the floating body layer 110A. The floating body layer 110B can have a predetermined body structure corresponding to an FD SOI transistor structure. The floating body layer 110B can have a particular thickness in a vertical direction between the gate layer 150B and the buried oxide layer 120B that results in operation of the transistor in accordance with an FD SOI transistor. For example, a thickness of the floating body layer 110B in accordance with an FD SOI transistor can be between 2 nm and 20 nm.

The buried oxide layer 120B can correspond at least partially in one or more of structure and operation to the buried oxide layer 120A. The buried oxide layer 120B can have a thickness less than a thickness of the buried oxide layer 120A. The source layer 130B can correspond at least partially in one or more of structure and operation to the source layer 130A. The source layer 130B can have a lower boundary adjacent to or in contact with the floating body layer 110B. The source layer 130B can have a thickness less than a thickness of the source layer 130A. The drain layer 140B can correspond at least partially in one or more of structure and operation to the drain layer 140A. The drain layer 140B can have a lower boundary adjacent to or in contact with the floating body layer 110B. The drain layer 140B can have a thickness less than a thickness of the drain layer 140A. The gate layer 150B can correspond at least partially in one or more of structure and operation to the gate layer 150A. The gate layer 150B can have a thickness greater than a thickness of the gate layer 150A.

Figure 2:
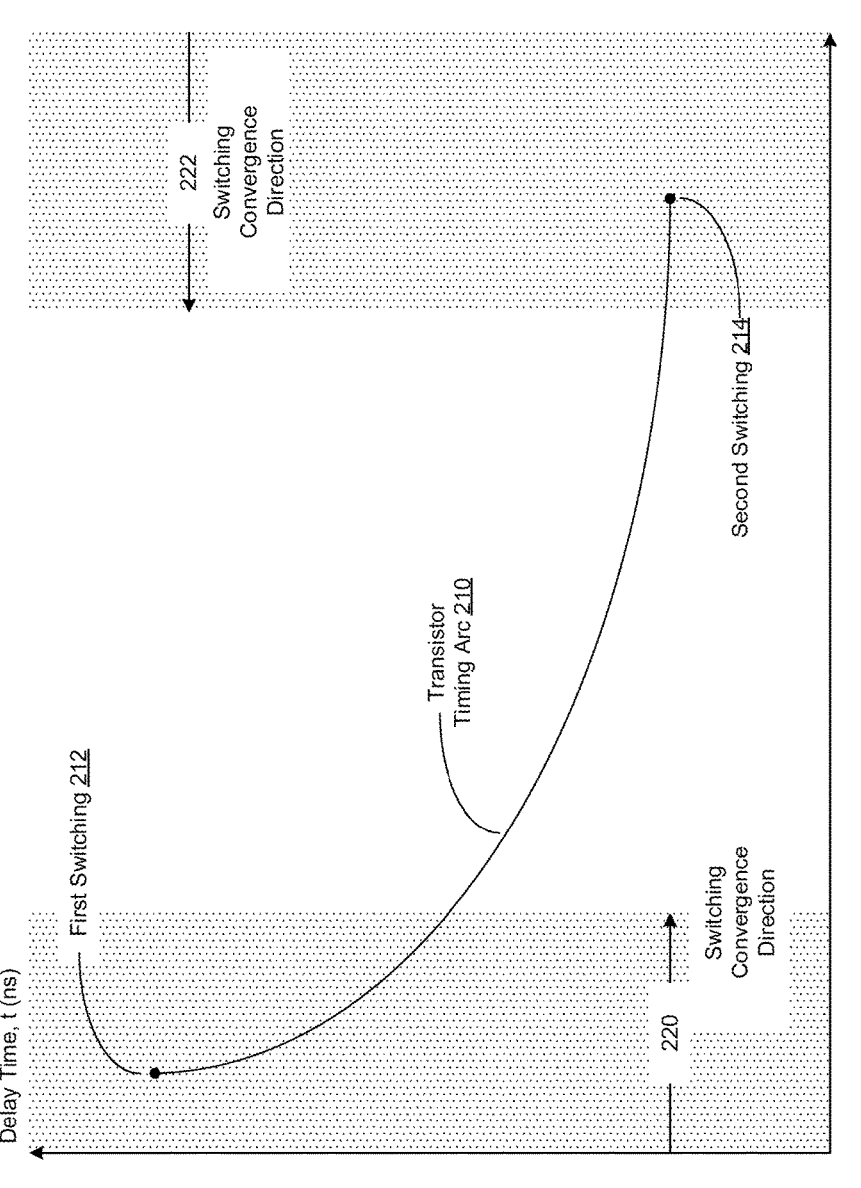
FIG. 2 illustrates a performance of simulation of a transistor, in accordance with some embodiments.

FIG. 2 illustrates a performance of simulation of a transistor in accordance with present implementations. As illustrated by way of example in FIG. 2, an example performance 200 can include a threshold voltage delay 210, a first switching point 212, a second switching point 214, a first converge direction 220, and a second convergence direction 222. At least the example system of FIG. 9 can execute a simulation based on the performance 200 according to present implementations.

The PD SOI transistors models can use a compact model to simulate transistors with individualized floating body voltage characteristics. For example, one or more transistors can each be set with a predetermined floating body voltage that can change in accordance with performance 200 during simulation to maintain high accuracy and speed of execution of a simulation of a circuit. For example, a simulation circuit can be configured, prior to execution of the simulation of the circuit, with a fixed minimum floating body voltage and fixed maximum floating body voltage by a voltage parameter of the simulation corresponding to a structure of each transistor.

The timing arc 210 can correspond to a delay performance with respect to a voltage of a particular transistor in a circuit. Based on the timing arc 210 of a transistor, a transistor can have a specific floating body voltage corresponding to minimum and maximum timing bounds. The first switching point 212 can correspond to a condition in which the transistor has had no switching history or previous switching activity. The second switching point 214 can correspond to a condition in which the transistor has had switching history or a previous switching activity. The impact of history can thus be directly applied locally to each transistor, based on the topology transistor in the circuit. The first switching point 212 can be associated with a lack of switching history, for a rising switching action of a transistor. The second switching point 214 can be associated with a switching action subsequent to previous switching and the presence of switching history, for the rising switching action of a transistor. Conversely, the second switching point 214 can be associated with a lack of switching history, for a falling switching action of a transistor. The first switching point 212 can be associated with a switching action subsequent to previous switching and the presence of switching history for the falling switching action of a transistor. The first converge direction 220 can correspond to a direction of change of the floating body voltage of a transistor in response to a rising switching action of the transistor. The second convergence direction 222 can correspond to a direction of change of the floating body voltage of a transistor in response to a falling switching action of the transistor.

A system can modify one or more transistors in a circuit having an SOI structure with corresponding floating body voltages based on the characteristics of each individual transistor, according to the example values of Table 1. A floating body voltage can be set for each transistor based on one or more of the type of delay, the type of switching action, the doping characteristic of the transistor, and the type of circuit connection of the transistor. The floating body voltage can be set at a high side or at a low side. For example, a high side voltage can be set to a level higher than a highest voltage input to the system to advantageously eliminate jitter or other destabilizing operation of the circuit. For example, the high side voltage can be set to twice a system input voltage VDD, at 2VDD. For example, a low side voltage can be set to a level lower than a lowest voltage of the system to advantageously eliminate jitter or other destabilizing operation of the circuit. For example, the high side voltage can be set to ground or to a negative magnitude of the system input voltage VDD, at 0 V or −VDD.

TABLE 1

| Delay Type | Switching Action | Transistor Type | Connection Type | Floating Body Voltage |
|---|---|---|---|---|
| Minimum | Rise | PMOS | Stack, PG | 2 VDD |
| Minimum | Rise | NMOS | Stack | 0, −VDD |
| Minimum | Rise | NMOS | PG | 2 VDD |
| Minimum | Fall | PMOS | Stack | 0, −VDD |
| Minimum | Fall | PMOS | PG | 2 VDD |
| Minimum | Fall | NMOS | Stack, PG | 2 VDD |
| Maximum | Rise | PMOS | Stack, PG | 0, −VDD |
| Maximum | Rise | NMOS | Stack | 2 VDD |
| Maximum | Rise | NMOS | PG | 0, −VDD |
| Maximum | Fall | PMOS | Stack | 2 VDD |
| Maximum | Fall | PMOS | PG | 0, −VDD |
| Maximum | Fall | NMOS | Stack, PG | 0, −VDD |

The type of delay can be at least bounded by a maximum delay or a minimum delay. The type of switching action can include a rising or falling edge action. The doping characteristic of the transistor can include at least an NMOS doping characteristic or a PMOS doping characteristic. The type of circuit connection of the transistor can include a stack configuration or a parallel (PG) configuration.

FIG. 3 illustrates a delay performance of simulation of a transistor in accordance with present implementations. As illustrated by way of example in FIG. 3, an example performance 300 can include a plurality of switching events 302, a plurality of first dynamic switching delays 310, a plurality of second dynamic switching delays 312, a plurality of first static switching delays 320, and a plurality of second static switching delays 322.

The switching events 302 can each correspond to a particular switching event in a sequence of switching events over time. For example, switching event 302-1 can be a first switching event with no previous switching history, and switching event 302-12 can be a switching event during simulation that occurs after all of the switching events 302-1 through 302-11.

The first dynamic switching delays 310 can correspond to switching delays of a minimum delay type by dynamic switching according to performance 200. The first static switching delays 312 can correspond to switching delays of a minimum delay type by static switching, and can correspond to a lower delay bound of each of the first dynamic switching delays 310 at a particular switching event. The first dynamic switching delays 310 can advantageously be greater than the first static switching delays 312, and be bounded by the first static switching delays 312. For example, the first static switching delays 312 at switching event 302-1 can be a lower bound to the first dynamic switching delays 310 at the switching event 302-1. For example, the first static switching delays 312 at switching event 302-2 can be a lower bound to the first dynamic switching delays 310 at the switching event 302-2.

The second dynamic switching delays 320 can correspond to switching delays of a maximum delay type by dynamic switching according to performance 200. The second static switching delays 322 can correspond to switching delays of a maximum delay type by static switching, and can correspond to an upper delay bound of each of the second dynamic switching delays 320 at a particular switching event. The second dynamic switching delays 320 can advantageously be less than the second static switching delays 322, and be bounded by the second static switching delays 322. For example, the second static switching delays 322 at switching event 302-1 can be an upper bound to the second dynamic switching delays 320 at the switching event 302-1. For example, the second static switching delays 322 at switching event 302-2 can be an upper bound to the second dynamic switching delays 320 at the switching event 302-2.

TABLE 2

| Circuit Type | Circuit Action | Action Identifier | Maximum Static Delay (ns) | Maximum Dynamic Delay (ns) | Minimum Static Delay (ns) | Minimum Dynamic Delay (ns) |
|---|---|---|---|---|---|---|
| Inverter | A(R), Y(F) | 1 | 48.78 | 46.198 | 43.59 | 42.62 |
| Inverter | A(F), Y(R) | 2 | 61.91 | 60.95 | 53.7 | 53.89 |
| Buffer | A(R), Y(R) | 3 | 55.83 | 51.04 | 42.03 | 44.03 |
| Buffer | A(F), Y(F) | 4 | 49.45 | 47.41 | 41 | 40.5 |
| NAND | A(R), Y(F) | 5 | 70.19 | 66.5 | 62.8 | 60.48 |
| NAND | A(F), Y(R) | 6 | 62.4 | 61.45 | 53.84 | 54.27 |
| NAND | B(R), Y(F) | 7 | 69.56 | 65.7 | 62.78 | 60.26 |
| NAND | B(F), Y(R) | 8 | 57.83 | 61.2 | 53.63 | 54.01 |
| NOR | A(R), Y(F) | 9 | 51.46 | 48.89 | 46.37 | 45.27 |
| NOR | A(R), Y(F) | 10 | 81.39 | 80.372 | 68.728 | 67.84 |
| NOR | B(R), Y(F) | 11 | 50 | 48.693 | 46.175 | 45.02 |
| NOR | B(F), Y(R) | 12 | 79.5 | 78.94 | 69.447 | 67.52 |

As illustrated by way of example in Table 2, execution of a circuit simulation within maximum and minimum static delay boundaries can vary based on circuit type and circuit action. For example, an inverter and a buffer can each include a single input A, and a single output Y, and a NAND gate and a NOR gate can each include a two inputs A and B, and a single output Y. An input can receive a rising edge input R or a falling edge input F at one or more of inputs A and B, and can cause a rising edge output R or a falling edge output at Y. For example, in Action 1, an inverter can receive a rising edge input at input A, denoted by A(R), and can cause a falling edge output at output Y, denoted by Y(F). Here, the inverter can have a maximum dynamic delay of 46.198, under the maximum delay upper bound of 48.78, and can have a minimum dynamic delay of 43.59, over the minimum delay lower bound of 42.62. Actions 2-12 can have performance denoted in accordance with the performance of Action 1 discussed herein.

Figure 4:
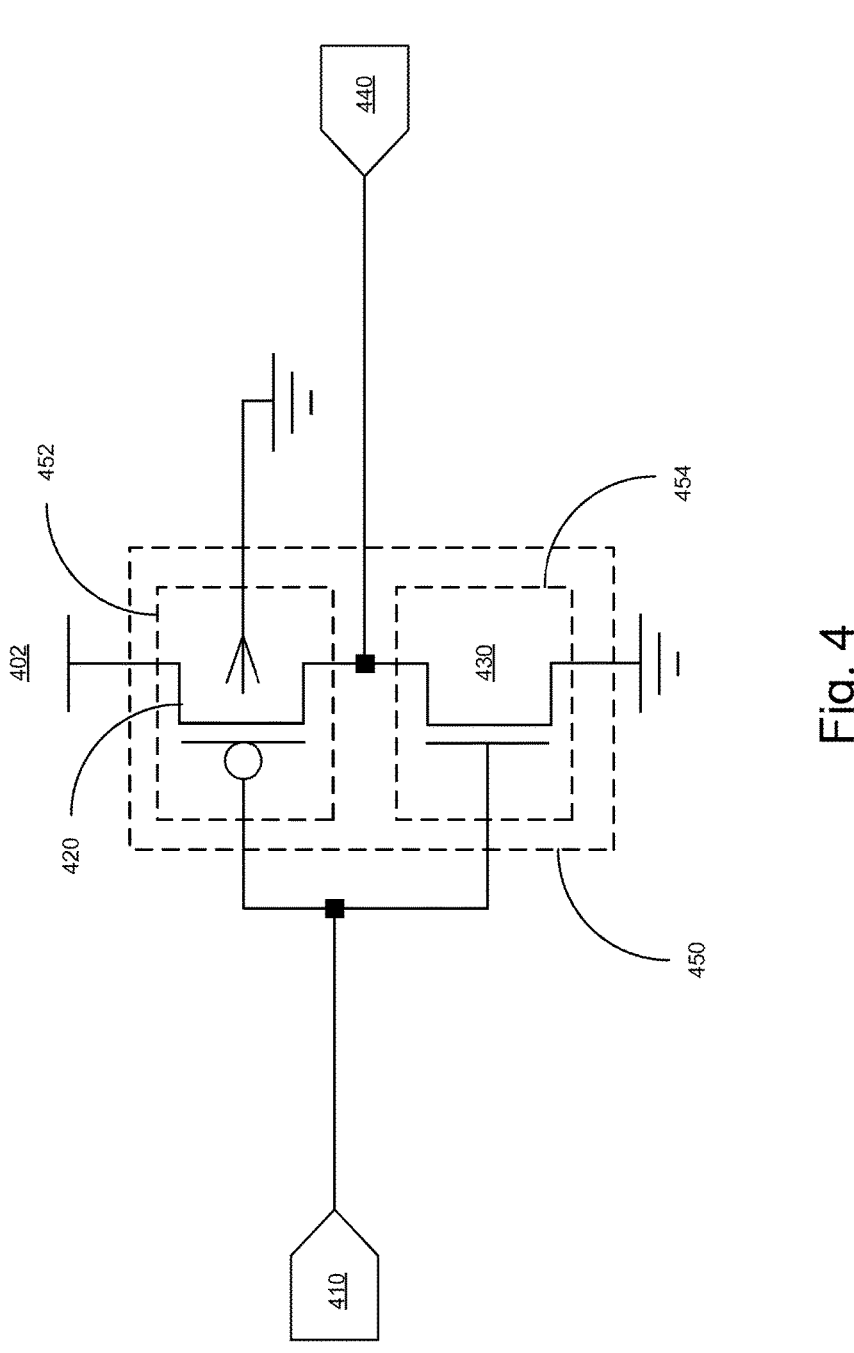
FIG. 4 illustrates an inverter circuit including transistors associated with various channel-connected regions of a circuit, in accordance with some embodiments.

FIG. 4 illustrates an inverter circuit including transistors associated with various channel-connected regions of a circuit, in accordance with present implementations. As illustrated by way of example in FIG. 4, an example inverter circuit 400 can include a system voltage node 402, an input 410, a first transistor 420, a second transistor 430, and an output 440. The input 410 can correspond to an "A" input as discussed herein, and the output 440 can correspond to a "Y" output as discussed herein. The first transistor 420 and the second transistor 430 can have a connection type corresponding to a stack connection, and can be identified within a channel-connected region 450. The first transistor 420 can be selected as a first PD SOI transistor by selection 452, and the second transistor 430 can be selected as a second PD SOI transistor by selection 454. The system voltage node 402 can correspond to a VDD voltage as discussed herein. The first transistor 420 can include an inverting input at a gate terminal thereof, and can include a ground connection to a body thereof.

Figure 5:
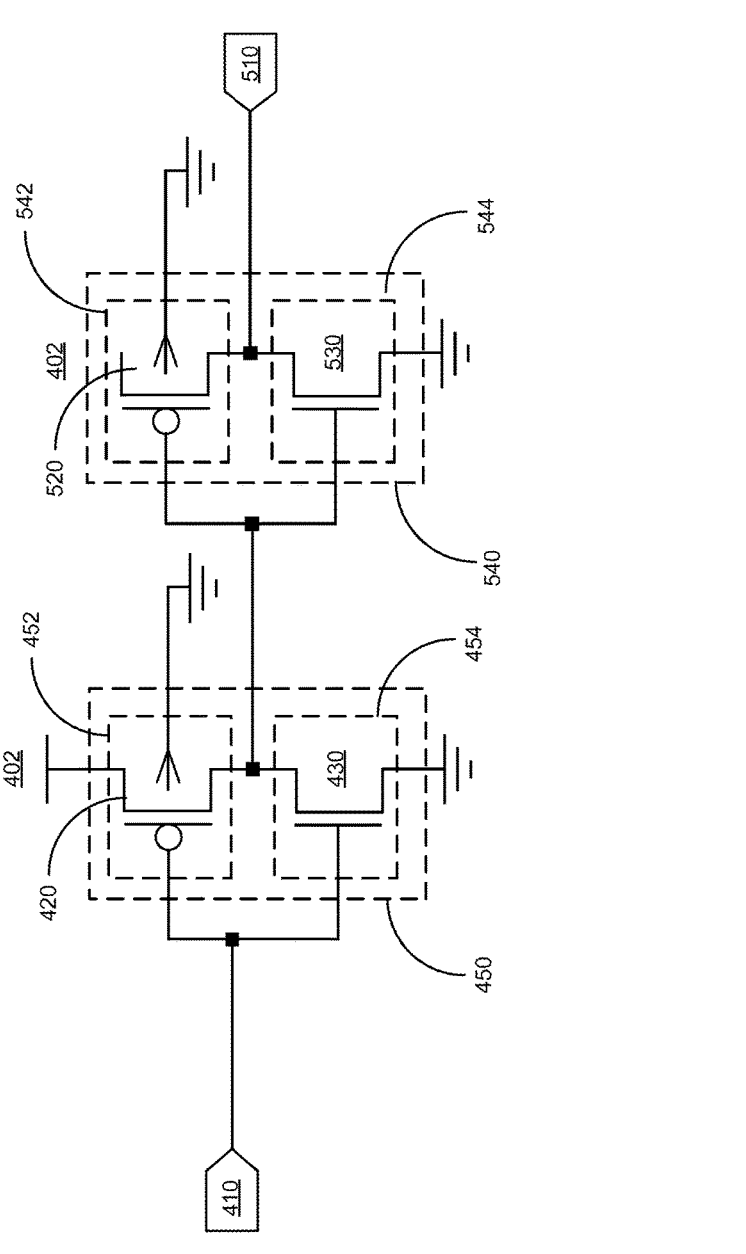
FIG. 5 illustrates a buffer circuit including transistors associated with various channel-connected regions of a circuit, in accordance with some embodiments.

FIG. 5 illustrates a buffer circuit including transistors associated with various channel-connected regions of a circuit, in accordance with present implementations. As illustrated by way of example in FIG. 5, an example buffer circuit 500 can include the system voltage node 402, the input 410, the first transistor 420, the second transistor 430, an output 510, a third transistor 520, and a fourth transistor 530. The output 510 can correspond to a "Y" output as discussed herein. The third transistor 520 and the fourth transistor 530 can have a connection type corresponding to a stack connection, and can be identified within a channel-connected region 540 distinct from the channel-connected region 450. The third transistor 520 can be selected as a third PD SOI transistor by selection 542, and the fourth transistor 530 can be selected as a fourth PD SOI transistor by selection 544. The third transistor 520 can include an inverting input at a gate terminal thereof, and can include a ground connection to a body thereof.

Figure 6:
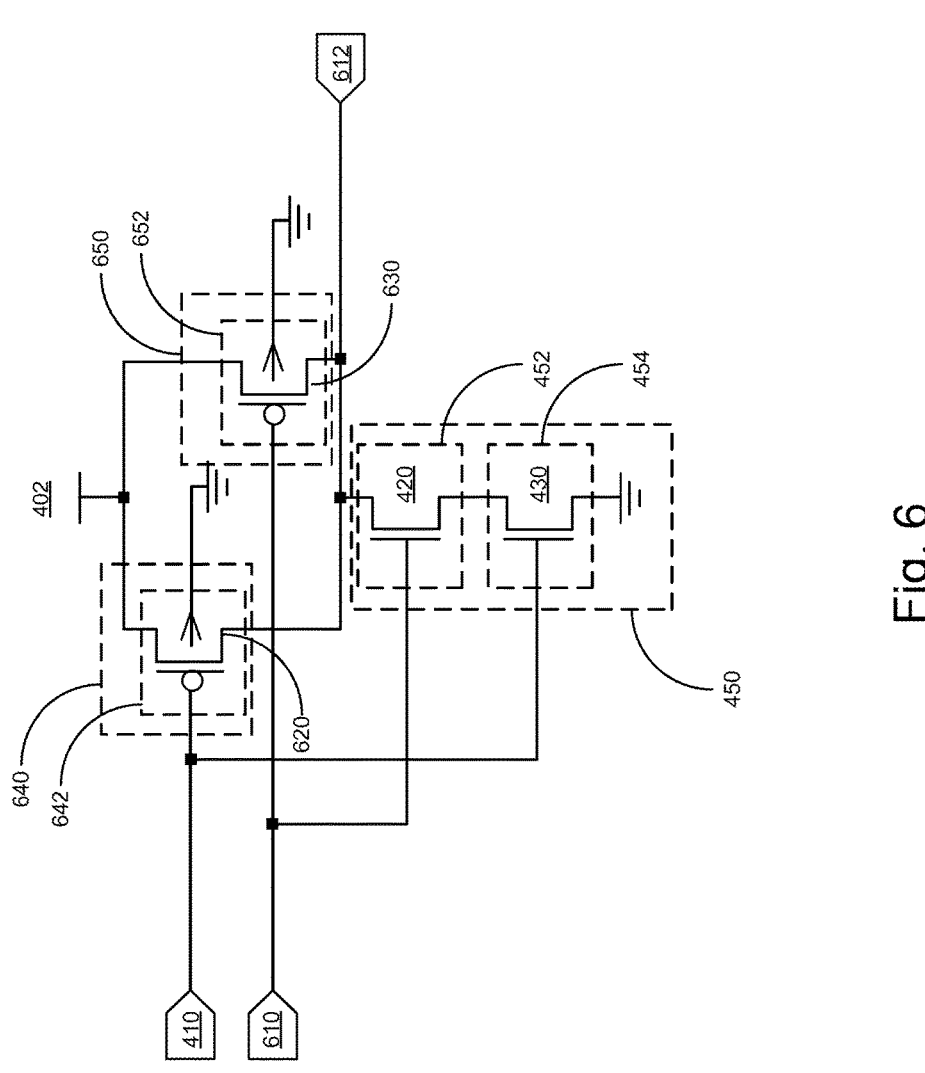
FIG. 6 illustrates a NAND circuit including transistors associated with various channel-connected regions of a circuit, in accordance with some embodiments.

FIG. 6 illustrates a NAND circuit including transistors associated with various channel-connected regions of a circuit, in accordance with present implementations. As illustrated by way of example in FIG. 6, an example NAND circuit 600 can include the system voltage node 402, the input 410, the first transistor 420, the second transistor 430, an input 610, an output 612, a third transistor 620, and a fourth transistor 630. The input 610 can correspond to a "B" input as discussed herein, and the output 612 can correspond to a "Y" output as discussed herein. The third transistor 520 and the fourth transistor 530 can have a connection type distinct from either a stack connection or a PG connection, and can respectively be identified channel-connected regions 640 and 650 distinct from each other and the channel-connected region 450. The third transistor 620 can be selected as a third PD SOI transistor by selection 642, and the fourth transistor 630 can be selected as a fourth PD SOI transistor by selection 644. The third transistor 620 and the fourth transistor 630 can each include an inverting input at a gate terminal thereof, and can include a ground connection to a body thereof.

Figure 7:
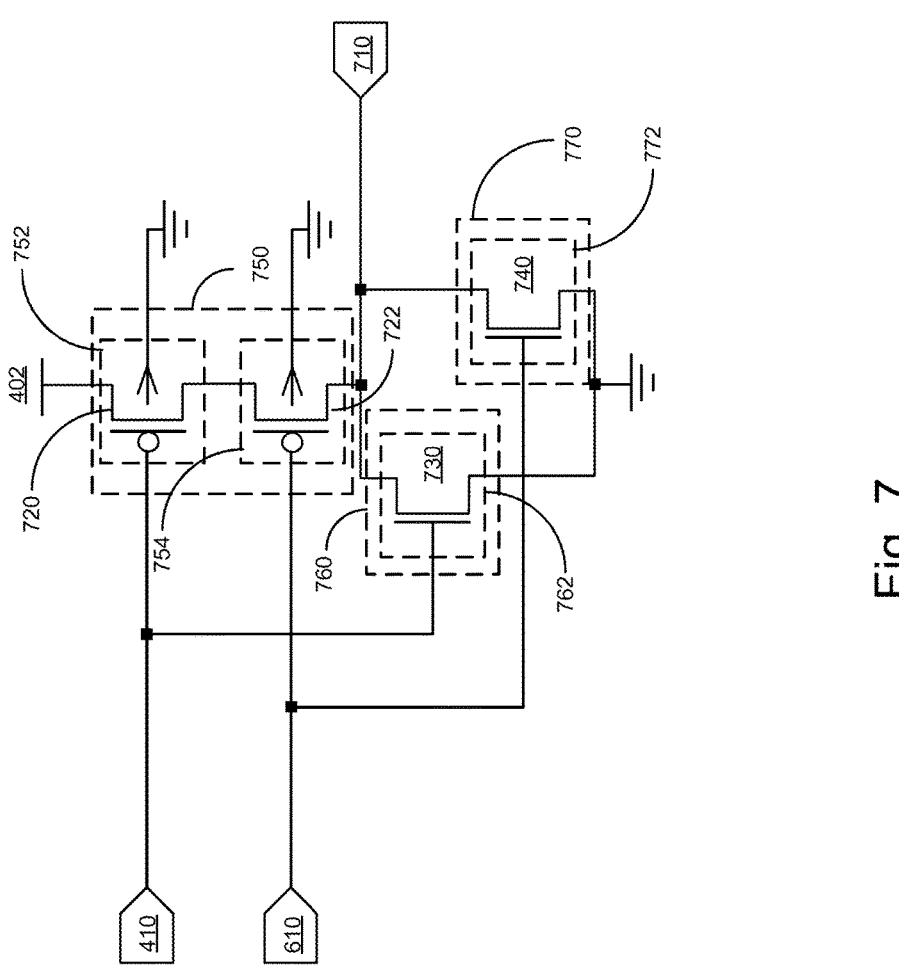
FIG. 7 illustrates a NOR circuit including transistors associated with various channel-connected regions of a circuit, in accordance with some embodiments.

FIG. 7 illustrates a NOR circuit including transistors associated with various channel-connected regions of a circuit, in accordance with present implementations. As illustrated by way of example in FIG. 7, an example NOR circuit 700 can include the system voltage node 402, the input 410, the input 610, an output 710, a first transistor 720, a second transistor 722, a third transistor 730, and a fourth transistor 740. The output 710 can correspond to a "Y" output as discussed herein. The first transistor 720 and the second transistor 722 can have a connection type corresponding to a stack connection, and can be identified within a channel-connected region 750. The first transistor 720 can be selected as a first PD SOI transistor by selection 752, and the second transistor 722 can be selected as a second PD SOI transistor by selection 754. The third transistor 730 and the fourth transistor 740 can have a connection type distinct from either a stack connection or a PG connection, and can respectively be identified channel-connected regions 760 and 770 distinct from each other and the channel-connected region 750. The third transistor 730 can be selected as a third PD SOI transistor by selection 762, and the fourth transistor 740 can be selected as a fourth PD SOI transistor by selection 772. The first transistor 720 and the second transistor 722 can each include an inverting input at a gate terminal thereof, and can include a ground connection to a body thereof.

Figure 8:
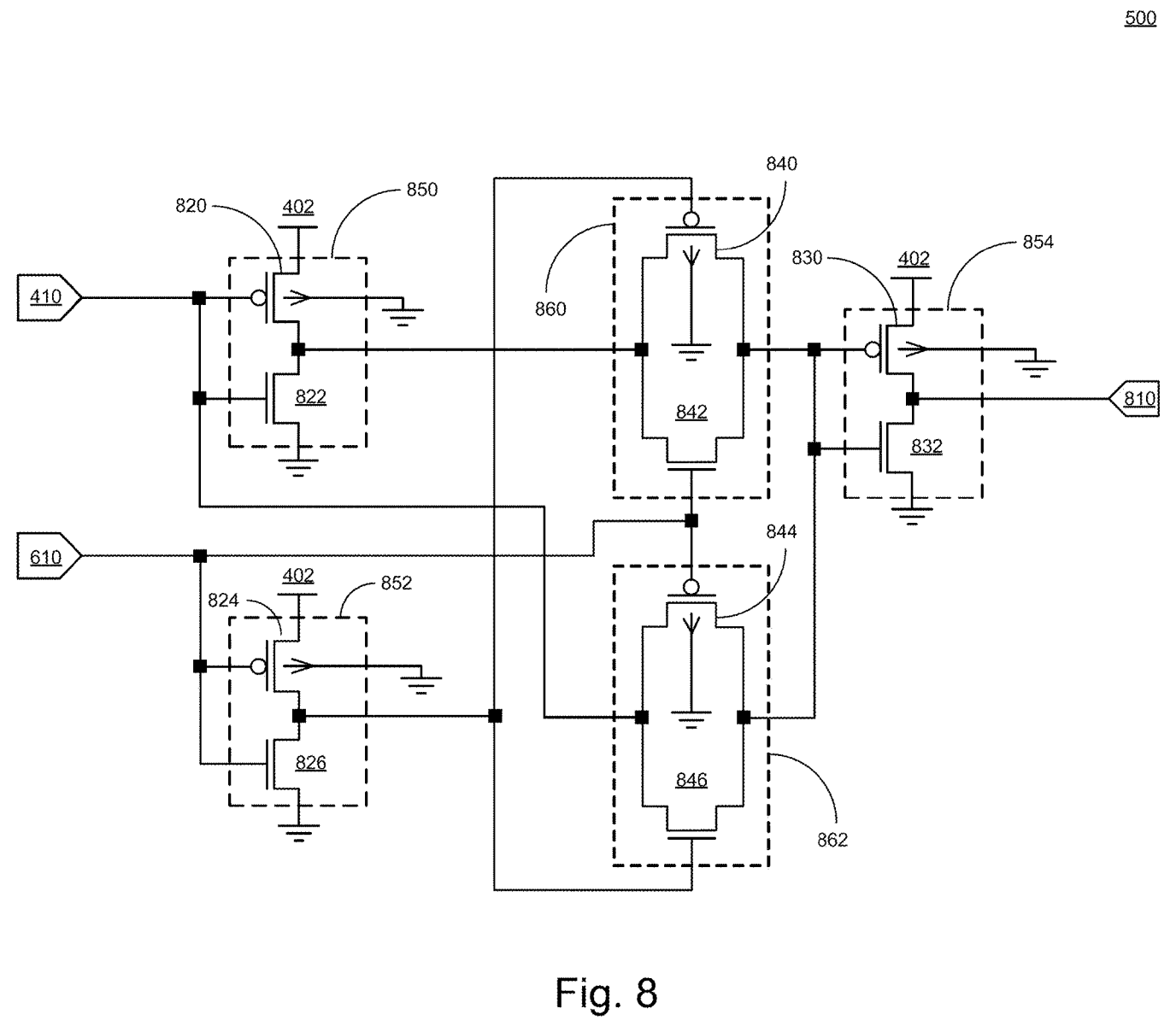

FIG. 8 illustrates a circuit including transistors associated with various channel-connected regions of a circuit, in accordance with present implementations. As illustrated by way of example in FIG. 8, an example circuit 800 can include the system voltage node 402, the input 410, the input 610, an output 810, a first transistor 820, a second transistor 822, a third transistor 824, a fourth transistor 826, a fifth transistor 830, a sixth transistor 832, a seventh transistor 840, an eighth transistor 842, a ninth transistor 844, and a tenth transistor 846. The output 810 can correspond to a "Y" output as discussed herein. The transistors 820, 822, 824, 826, 830, 832, 840, 842, 844 and 846 can be selected as a first PD SOI transistor by selections illustrated herein with respect to stack connections and PG connections corresponding to the circuits 400-700.

The circuit 810 can include a plurality of stack-connected transistors. The first transistor 820 and the second transistor 822 can have a connection type corresponding to a stack connection, and can be identified within a channel-connected region 850. The third transistor 824 and the fourth transistor 826 can have a connection type corresponding to a stack connection, and can be identified within a channel-connected region 852. The fifth transistor 830 and the sixth transistor 832 can have a connection type corresponding to a stack connection, and can be identified within a channel-connected region 854. The circuit 810 can include a plurality of PG-connected transistors. The seventh transistor 840 and the eighth transistor 842 can have a connection type corresponding to a PG connection, and can be identified within a channel-connected region 860. The ninth transistor 844 and the tenth transistor 846 can have a connection type corresponding to a PG connection, and can be identified within a channel-connected region 862.

Figure 9:
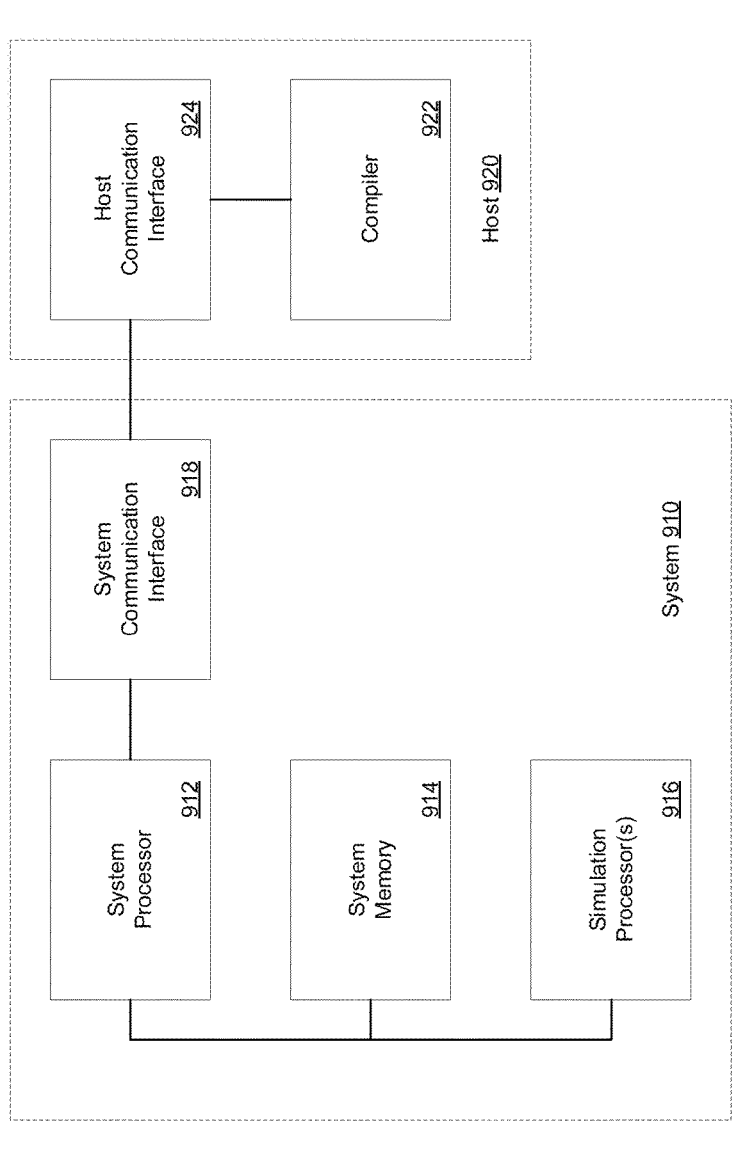
FIG. 9 illustrates a system, in accordance with some embodiments.

FIG. 9 illustrates a simulation system, according to an embodiment. As illustrated by way of example in FIG. 9, a simulation system 900 can include a system 910 and a host 920. The system 910 can include a system processor 912, a system memory 914, one or more simulation processors 916, and a system communication interface 918. The host 920 can include a compiler 922 and a host communication interface 924.

The system processor 912 can execute one or more instructions associated with the system 910. The system processor 912 can include an electronic processor, an integrated circuit, or the like including one or more of digital logic, analog logic, digital sensors, analog sensors, communication buses, volatile memory, nonvolatile memory, and the like. The system processor 912 can include, but is not limited to, at least one microcontroller unit (MCU), microprocessor unit (MPU), central processing unit (CPU), graphics processing unit (GPU), physics processing unit (PPU), embedded controller (EC), or the like. The system processor 912 can include a memory operable to store or storing one or more instructions for operating components of the system processor 912 and operating components operably coupled to the system processor 912. The one or more instructions can include at least one of firmware, software, hardware, operating systems, embedded operating systems, and the like. The system processor 912 or the system 910 generally can include at least one communication bus controller to effect communication between the system processor 912 and the other elements of the system 910.

The system memory 914 can store data associated with the system 910. The system memory 914 can include one or more hardware memory devices to store binary data, digital data, or the like. The system memory 914 can include one or more electrical components, electronic components, programmable electronic components, reprogrammable electronic components, integrated circuits, semiconductor devices, flip flops, arithmetic units, or the like. The system memory 914 can include at least one of a non-volatile memory device, a solid-state memory device, a flash memory device, and a NAND memory device. The system memory 914 can include one or more addressable memory regions disposed on one or more physical memory arrays. A physical memory array can include a NAND gate array disposed on, for example, at least one of a particular semiconductor device, integrated circuit device, and printed circuit board device.

The simulation processors 916 may execute one or more simulation instructions associated with corresponding parameters of a computing device or hardware system, for example. The simulation processors 916 may each include an electronic processor, an integrated circuit, or the like including one or more of digital logic, analog logic, digital sensors, analog sensors, communication buses, volatile memory, nonvolatile memory, and the like. The simulation processors 916 may each include one or more simulation cores, simulation registers, or simulation caches, for example, to execute the simulation instructions and perform a hardware-level simulation of a particular computing device or hardware system defined by the simulation instructions. The simulation processors 916 generally may each include at least one communication bus controller to effect communication between the simulation processors 916 and the other elements of the system 910. The simulation processors 916 may each include a processor memory that may store one or more instructions for operating components of a corresponding simulation processor 916 and operating components operably coupled to the corresponding simulation processor 916. The one or more instructions may include at least one of firmware, software, hardware, operating systems, embedded operating systems, simulation instructions and the like. The processor memory may receive simulation instructions and may store the simulation instructions at one or more memory locations of the processor memory. The processor memory may include one or more processor caches, or processor memory blocks, for example, that may operate at higher throughput, bandwidth, or the like, than the system memory 914. As one example, the processor memory may include at least one DDR memory.

The system communication interface 918 may communicatively couple the system 910 and the host 920 and may be integrated with the system. The system communication interface 918 may communicate one or more instructions, signals, conditions, states, or the like between one or more of the system 910 and the host 920. The system communication interface 918 may include one or more digital, analog, or like communication channels, lines, traces, or the like. As one example, the system communication interface 918 may include at least one high-bandwidth, serial or parallel communication line among multiple communication lines of a communication interface. The system communication interface 918 may include one or more wireless communication devices, systems, protocols, interfaces, or the like. The system communication interface 918 may include one or more logical or electronic devices including but not limited to integrated circuits, logic gates, flip flops, gate arrays, programmable gate arrays, and the like. The system communication interface 918 may include ones or more telecommunication devices including but not limited to antennas, transceivers, packetizers, and wired interface ports.

The compiler 922 may include one or more graphical user interfaces and one or more command line interfaces. The host communication interface 924 may communicatively couple the system 910 and the host 920, and may be integrated with the host 920. The host communication interface 924 may correspond at least partially in one or more of structure and operation to the system communication interface 918.

The data processing system can select, from among a plurality of identified transistors including the at least one identified transistor and within the region, at least one second selected transistor having a second doping property that corresponds to a second predetermined doping property. The data processing system can modify a voltage property of the at least one second selected transistor to have a second predetermined voltage property corresponding to a body voltage of the at least one second selected transistor.

The data processing system can execute, subsequent to the modification of the voltage property, a simulation of the circuit structure including the at least one selected transistor having the voltage property.

The data processing system can modify a second voltage property of the at least one selected transistor to have a second predetermined voltage property corresponding to a body voltage of the at least one selected transistor.

The data processing system can select, from among a plurality of identified transistors including the at least one identified transistor and within the region, at least one second selected transistor having a second doping property that corresponds to a second predetermined doping property. The data processing system can modify a voltage property of the at least one second selected transistor to have a second predetermined voltage property corresponding to a body voltage of the at least one second selected transistor.

The data processing system can execute, subsequent to the modification of the voltage property, a simulation of the circuit structure including the at least one selected transistor having the voltage property.

The data processing system can modify a second voltage property of the at least one selected transistor to have a second predetermined voltage property corresponding to a body voltage of the at least one selected transistor. The voltage property can correspond to a first threshold voltage at a rising edge of a switching action of the at least one selected transistor, and the second voltage property corresponding to a second threshold voltage at a falling edge of the switching action of the at least one selected transistor.

FIG. 10 illustrates a method for optimizing a transistor property in a circuit simulation in accordance with present implementations. At least the example system 900 can perform method 1000 according to present implementations. The method may be performed by at least one processor configured to execute computer-readable instructions stored on a non-transitory memory. The method 1000 can begin at step 1010.

At step 1010, the method 1000 can identify at least one transistor among a plurality of transistors. The predetermined body structure can correspond to a silicon-on-insulator (SOI) transistor structure. Step 1010 can include at least one of steps 1012 and 1014. At step 1012, the method 1000 can identify at least one transistor among a plurality of transistors in a circuit having a plurality of transistors. At step 1014, the method 1000 can identify at least one transistor among a plurality of transistors having a SOI transistor body type or structure. The method 1000 can then continue to step 1020.

At step 1020, the method 1000 can identify at least one channel-connected region including at least one identified transistor. Step 1020 can include at least one of steps 1022 and 1024. At step 1022, the method 1000 can identify at least one channel-connected region indicating a type of connection in a circuit. At step 1024, the method 1000 can identify at least one channel-connected region indicating a type of connection between at least one identified transistor and one or more transistors of a circuit. The method 1000 can then continue to step 1030.

At step 1030, the method 1000 can select at least one transistor having a particular doping property. For example, the method can select, from among a plurality of identified transistors including the at least one identified transistor, at least one second selected transistor having a second doping property that corresponds to a second predetermined doping property. For example, the method can modify a voltage property of the at least one second selected transistor to have a second predetermined voltage property corresponding to a body voltage of the at least one second selected transistor.

Step 1030 can include at least one of steps 1302, 1034 and 1036. At step 1032, the method 1000 can select at least one transistor having a particular doping property from among the at least one identified transistor. At step 1034, the method 1000 can select at least one transistor having a particular doping property from within at least one channel-connected region. At step 1036, the method 1000 can select at least one transistor having a particular doping property matching at least one of an NMOS doping property or a PMOS doping property. For example, the doping property can correspond to an NMOS doping characteristic, and the second doping property can correspond to a PMOS doping characteristic. For example, the doping property can correspond to an NMOS doping characteristic or a PMOS doping characteristic.

The method 1000 can then continue to step 1102.

Figure 11:
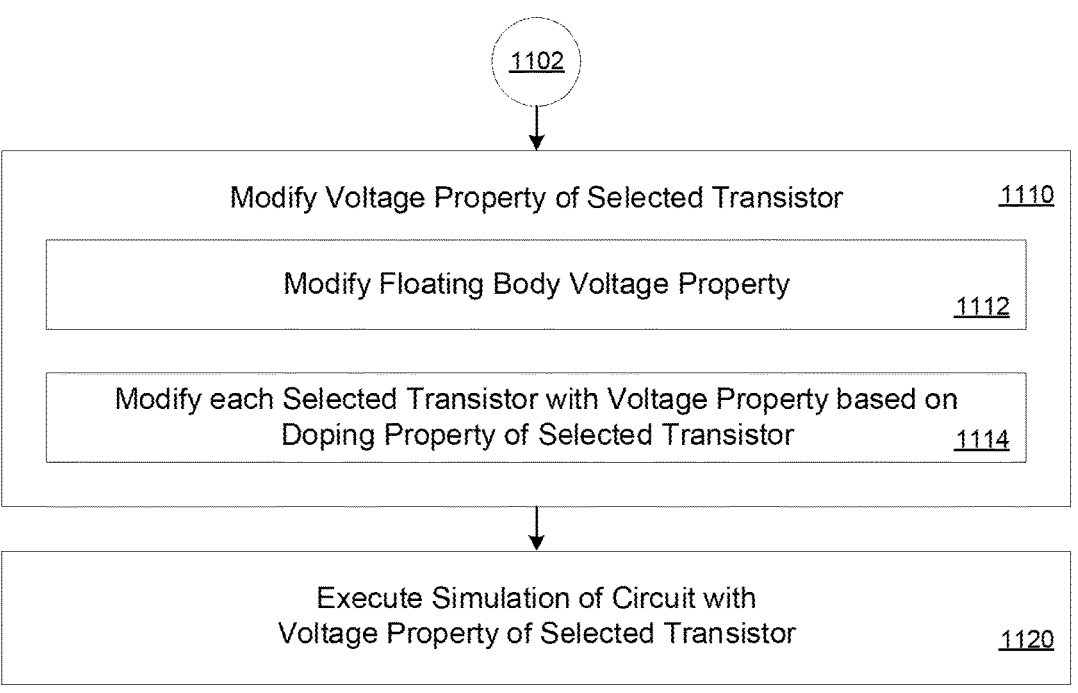
FIG. 11 illustrates a method for optimizing a transistor property in a circuit simulation further to the method of FIG. 10, in accordance with some embodiments.

FIG. 11 illustrates a method for optimizing a transistor property in a circuit simulation further to the method of FIG. 10. At least the example system 900 can perform method 1100 according to present implementations. The method 1100 can begin at step 1102. The method 1100 can then continue to step 1110.

At step 1110, the method 1100 can modify a voltage property of a selected transistor. For example, the method can modify a second voltage property of the at least one selected transistor to have a second predetermined voltage property corresponding to a body voltage of the at least one selected transistor. The voltage property can correspond to a first threshold voltage at a rising edge of a switching action of the at least one selected transistor, and the second voltage property can correspond to a second threshold voltage at a falling edge of the switching action of the at least one selected transistor.

Step 1110 can include at least one of steps 1112 and 1114. At step 1112, the method 1100 can modify a floating body voltage property of a selected transistor. At step 1114, the method 1100 can modify each selected transistor with a voltage property based on a doping property of a selected transistor. For example, a first transistor having an NMOS property can be modified to have a first floating body voltage, and a second transistor having a PMOS property can be modified to have a second floating body voltage. The method 1100 can then continue to step 1120.

At step 1120, the method 1100 can execute a simulation of a circuit with a voltage property of the selected transistor. For example, one or more of the system processor 912 and the simulation processor 916 can execute the simulation. For example, the method can execute, subsequent to the modifying the voltage property, a simulation of the circuit structure including the at least one selected transistor having the voltage property. The method 1100 can end at step 1120.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. A system to optimize a transistor property in a circuit simulation, the system comprising:

a data processing system comprising memory and one or more processors configured to:

identify, in a circuit structure having a plurality of transistors and based on a predetermined body structure, at least one identified transistor among the plurality of transistors having the predetermined body structure;

identify a region that includes the at least one identified transistor and that indicates a type of connection in the circuit structure between the at least one identified transistor and one or more of the plurality of transistors;

select, from among the at least one identified transistor and within the region, at least one selected transistor having a doping property that corresponds to a predetermined doping property;

modify a voltage property of the at least one selected transistor to have a predetermined voltage property corresponding to a body voltage of the at least one selected transistor and bounded by a maximum body voltage and a minimum body voltage; and execute, subsequent to modifying the voltage property, a simulation of the circuit structure including the at least one selected transistor having the voltage property.

2. The system of claim 1, the data processing system further configured to:

select, from among a plurality of identified transistors including the at least one identified transistor and within the region, at least one second selected transistor having a second doping property that corresponds to a second predetermined doping property; and modify a voltage property of the at least one second selected transistor to have a second predetermined voltage property corresponding to a body voltage of the at least one second selected transistor.

3. The system of claim 2, wherein the doping property corresponds to an NMOS doping characteristic, and the second doping property corresponds to a PMOS doping characteristic.

4. The system of claim 1, wherein the doping property corresponds to an NMOS doping characteristic or a PMOS doping characteristic.

5. The system of claim 1, the data processing system further configured to:

modify a second voltage property of the at least one selected transistor to have a second predetermined voltage property corresponding to a body voltage of the at least one selected transistor.

6. The system of claim 5, wherein the voltage property corresponds to a first threshold voltage at a rising edge of a switching action of the at least one selected transistor, and the second voltage property corresponds to a second threshold voltage at a falling edge of the switching action of the at least one selected transistor.

7. The system of claim 1, wherein the predetermined body structure corresponds to a silicon-on-insulator (SOI) transistor structure.

8. The system of claim 5, wherein the data processing system is further configured to execute the simulation of the circuit structure within a maximum delay and a minimum delay associated with the switching action of the at least one selected transistor.

9. A method for optimizing a transistor property in a circuit simulation, the method comprising:

identifying, by at least one processor, in a circuit structure having a plurality of transistors and based on a predetermined body structure, at least one identified transistor among the plurality of transistors having the predetermined body structure, the at least one identified transistor corresponding to a type of connection in the circuit structure between the at least one identified transistor and one or more of the plurality of transistors;

selecting, by the at least one processor, from among the at least one identified transistor, at least one selected transistor having a doping property that corresponds to a predetermined doping property;

modifying, by the at least one processor, a voltage property of the at least one selected transistor to have a predetermined voltage property corresponding to a body voltage of the at least one selected transistor and bounded by a maximum body voltage and a minimum body voltage; and executing, by the at least one processor, subsequent to modifying the voltage property, a simulation of the circuit structure including the at least one selected transistor having the voltage property.

10. The method of claim 9, further comprising:

selecting, by the at least one processor, from among a plurality of identified transistors including the at least one identified transistor, at least one second selected transistor having a second doping property that corresponds to a second predetermined doping property; and modifying, by the at least one processor, a voltage property of the at least one second selected transistor to have a second predetermined voltage property corresponding to a body voltage of the at least one second selected transistor.

11. The method of claim 10, wherein the doping property corresponds to an NMOS doping characteristic, and the second doping property corresponds to a PMOS doping characteristic.

12. The method of claim 9, wherein the doping property corresponds to an NMOS doping characteristic or a PMOS doping characteristic.

13. The method of claim 9, further comprising:

modifying, by the at least one processor, a second voltage property of the at least one selected transistor to have a second predetermined voltage property corresponding to a body voltage of the at least one selected transistor.

14. The method of claim 13, wherein the voltage property corresponds to a first threshold voltage at a rising edge of a switching action of the at least one selected transistor, and the second voltage property corresponds to a second threshold voltage at a falling edge of the switching action of the at least one selected transistor.

15. The method of claim 9, wherein the predetermined body structure corresponds to a silicon-on-insulator (SOI) transistor structure.

16. The method of claim 14, further comprising executing, by the at least one processor, the simulation of the circuit structure within a maximum delay and a minimum delay associated with the switching action of the at least one selected transistor.

17. A system to optimize a transistor property in a circuit simulation, the system comprising:

a data processing system comprising memory and one or more processors configured to:

identify, in a circuit structure having a plurality of transistors and based on a silicon-on-insulator (SOI)

transistor structure, at least one identified transistor among the plurality of transistors having the SOI transistor structure;

identify a region that includes the at least one identified transistor and that indicates one or more of a stack connection, a pull-up connection, and a pull-down connection in the circuit structure between the at least one identified transistor and one or more of the plurality of transistors;

select, from among the at least one identified transistor and within the region, at least one selected transistor having a doping property that corresponds to a predetermined doping property;

modify a voltage property of the at least one selected transistor to have a predetermined voltage property corresponding to a body voltage of the at least one selected transistor and bounded by a maximum body voltage and a minimum body voltage; and execute, subsequent to modifying the voltage property, a simulation of the circuit structure including the at least one selected transistor having the voltage property.

18. The system of claim 17, the data processing system further configured to:

select, from among a plurality of identified transistors including the at least one identified transistor and within the region, at least one second selected transistor having a second doping property that corresponds to a second predetermined doping property; and modify a voltage property of the at least one second selected transistor to have a second predetermined voltage property corresponding to a body voltage of the at least one second selected transistor.

19. The system of claim 17, the data processing system further configured to:

modify a second voltage property of the at least one selected transistor to have a second predetermined voltage property corresponding to a body voltage of the at least one selected transistor, the voltage property corresponding to a first threshold voltage at a rising edge of a switching action of the at least one selected transistor, and the second voltage property corresponding to a second threshold voltage at a falling edge of the switching action of the at least one selected transistor.

20. The system of claim 8, wherein the data processing system is further configured to execute the simulation of the circuit structure including the at least one selected transistor having the voltage property within a maximum delay and a minimum delay associated with the switching action of the at least one selected transistor.

* * * * *